United States Patent [19]

Doellner

[11] Patent Number: 5,129,223
[45] Date of Patent: Jul. 14, 1992

[54] RADIANT ENERGY POWER SOURCE STRUCTURE

[76] Inventor: Oscar L. Doellner, 1943 S. Plumer, Tucson, Ariz. 85713

[21] Appl. No.: 334,341

[22] Filed: Apr. 7, 1989

[51] Int. Cl.$^5$ ................................................ F02G 1/00
[52] U.S. Cl. ...................................... 60/39.33; 60/752
[58] Field of Search ..................... 60/39.33, 39.07, 722, 60/752

[56] References Cited

U.S. PATENT DOCUMENTS

| | | |
|---|---|---|
| 3,161,375 | 12/1964 | Ruhge . |
| 3,504,490 | 4/1970 | Klamm . |
| 3,811,181 | 5/1974 | Leinkram . |
| 3,833,425 | 9/1974 | Leinkram . |
| 3,943,726 | 3/1976 | Miller . |
| 4,090,359 | 5/1978 | Doellner . |
| 4,776,895 | 10/1988 | Goldstein ............................ 136/253 |
| 4,836,862 | 6/1989 | Pelka et al. ........................ 136/253 |

Primary Examiner—Louis J. Casaregola
Assistant Examiner—Timothy S. Thorpe
Attorney, Agent, or Firm—Don J. Flickinger; Jordan M. Meschkow

[57] ABSTRACT

A radiant energy power source structure for providing electrical power to a jet aircraft is disclosed. The device comprises a plurality of inward facing longitudinal ribs arranged in an annular configuration positioned radially outward of the plurality of perforations in the combustion liner of a jet engine. The longitudinal ribs are attached to a base which are a part of the outer combustion casing in the combustion section of the jet engine. In addition to air passing over the longitudinal ribs, helically wrapped fuel passageways are additionally incorporated into the base. Interiorly to the channels formed by the longitudinal ribs are an upper and lower groove formed in each longitudinal rib, the lower of the two grooves adapted to receive a plurality of photovoltaic cells receiving the radiant energy, the photovoltaic cells arranged in a series electrical connection in the circular direction. The circular series is broken at one point to carry off the electrical power. Immediately inward of the photovoltaic cells in each formed channel is a protective plate securing the cell against dust particles carried by the incoming air and possible flame emission from the combustion liner. Means are further provided to bleed air into an air gap created between the cell and the protective plate in order to equalize air pressure on both sides of the plate.

15 Claims, 2 Drawing Sheets

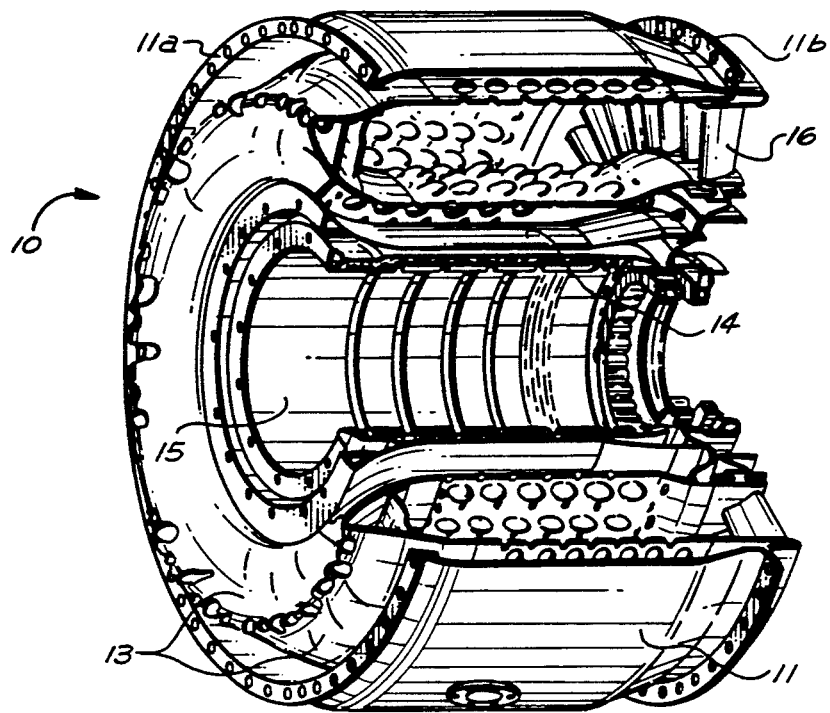
FIG. 1 — PRIOR ART
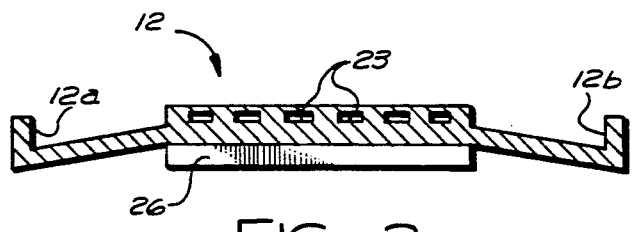
FIG. 2
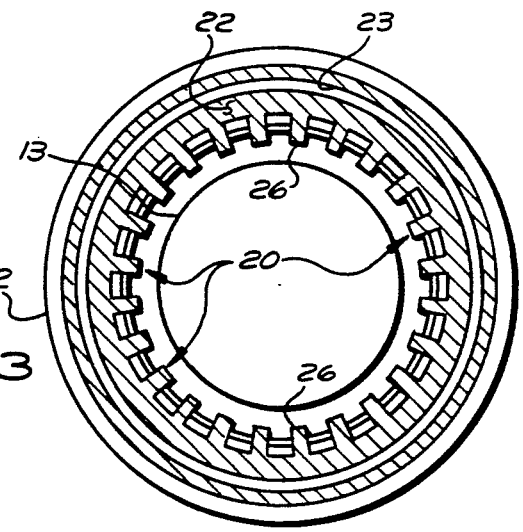
FIG. 3
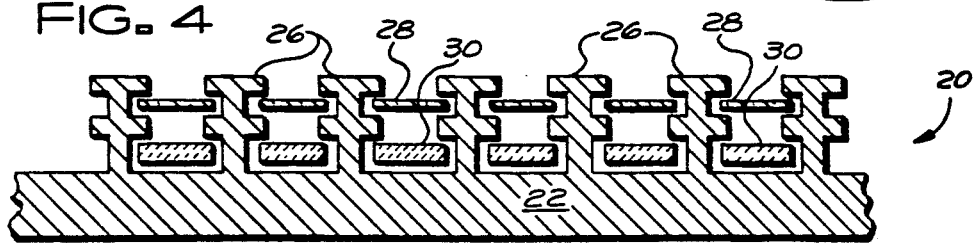
FIG. 4

3
RADIANT ENERGY POWER SOURCE STRUCTURE

BACKGROUND OF THE INVENTION

1. Field of the Invention

The field of the invention is devices for providing electrical power aboard jet aircraft. The Government of the United States of America has rights in this invention pursuant to Grant No. DE-FG01-86CE-15301 awarded by the U.S. Department of Energy.

2. Description of the Related Art

The Applicant's prior U.S. Pat. No. 4,090,359 issued May 23, 1978 and entitled "RADIANT ENERGY POWER SOURCE FOR JET AIRCRAFT AND MISSILES" details a power source which derives electrical energy from the radiant energy emitted from a jet engine. This is accomplished by placing photovoltaic cells proximate the jet engine combustion liner and interiorly the jet engine combustion casing.

Since the issuance of Applicant's prior patent, Applicant has continued to improve upon the basic underlying concept in respect of structural features encapsulating the radiant energy power source.

Applicant herein details structural features which he believes substantially improves the utilization of his prior invention.

SUMMARY OF THE INVENTION

This invention relates to structure integrated into a jet engine or gas turbine utilizing its radiant energy for providing electrical power to the vehicle having the jet engine or gas turbine. More specifically, the subject invention comprises the center frame structure securing the radiant energy receiving photovoltaic cells into the outer combustion casing proximate the combustion liner of the jet engine or gas turbine. The photovoltaic cells receive radiant energy from the burning fuel via a plurality of perforations in the jet engine combustion liner surrounding the burning fuel. Additionally, it is entirely conceivable that the combustion liners in future jet engines may be composed of radiant energy transparent materials. These photovoltaic cells are integrated into an annular cylindrical structure having a plurality of longitudinal channels formed by spaced apart ribs throughout its interior periphery.

The radiant energy power source structure containing the photovoltaic cells comprises firstly a base defining a cylindrical sleeve, the base having on its interior peripheral surface a plurality of inwardly protruding longitudinal ribs forming the photovoltaic cell channels therebetween. The longitudinal ribs are characterized by a pair of longitudinal grooves formed in the protruding ribs, one groove proximate the base adapted to receive and secure a plurality of photovoltaic cells in a fixed position, allowances being made however for physical expansion of the cells as a result of their increasing temperature during use. Photovoltaic cells completely blanket the interior peripheral surface of the radiant energy power source structure. The cells are connected in an annular or circular series by electrical wires attaching at opposite sides of each cell and passing through openings formed transversely in the longitudinal ribs immediately above the groove securing the photovoltaic cell.

Immediately above the photovoltaic cell situated in a second elongated groove formed in each rib is a transparent protective plate adapted to protect the photovoltaic cell from dust and other particles in the air passing between the radiant energy power source structure and the outside peripheral shell of the combustion liner. Like the photovoltaic cell, means are implemented within the second groove to permit physical expansion of the transparent protective plate as its temperature rises when the invention is in operation.

The base to which the longitudinal ribs are secured provides a heat sink for excess radiant heat energy received by the photovoltaic cells and the ribs. The base is further characterized by helical wound fuel passageways encapsulated within the base providing for heat in the base to be transferred to circulating jet engine fuel on its way to the fuel injectors which spray fuel into the combustion liner of the jet engine. In the preferred embodiment, the base is a part of the outer combustion casing of the jet engine for the engine's combustion section and may be one piece rather than a composition of various parts.

Means are also provided to utilize the incoming air passing between the combustion liner and the invention to enter into the gap between the photovoltaic cells and the transparent protective plate in order to equalize the air pressure on both sides of the protective plate to protect against damage caused by stress that may be placed upon the protective plates and photovoltaic cells. Additional means are detailed to protect the entrance into the air gap between the protective plate and photovoltaic cell in such a way as to exclude dirt particles or other debris in the incoming air from clogging the air passageway communicating the incoming air into the air gap.

It is an object of the subject invention to provide a structure integrated into a jet engine for securing the photovoltaic cells receiving radiant energy from the engine for conversion to electrical energy and use by the aircraft.

It is another object of the subject invention to provide means to protect the photovoltaic cells surrounding a jet engine combustion liner from damage due to particles in the incoming air.

It is still another object of the subject invention to provide means to electrically interconnect the photovoltaic cells to conduct the generated electrical power to the aircraft.

It is still further another object of the subject invention to provide a structure to secure photovoltaic cells surrounding a jet engine combustion liner which renders relatively easy access to and replacement of the photovoltaic cells.

Other objects of the invention will in part be obvious and will in part appear hereinafter. The invention accordingly comprises the apparatus comprising construction, combination of elements, and arrangement of parts which are exemplified in the following detailed disclosure and the scope of the invention which will be indicated in the Claims.

BRIEF DESCRIPTION OF THE DRAWINGS

For further understanding of the nature and objects of the subject invention, reference should be had to the following detailed description taken in connection with the accompanying drawings wherein:

FIG. 1 is a perspective view of the prior art jet engine;

FIG. 2 is a diagramic cross-sectional drawing of the subject invention taken in the engine longitudinal direction;

FIG. 3 is a diagramic cross-sectional front view of the subject invention in place in a jet engine;

FIG. 4 is a cross-sectional view of a portion of the subject invention;

In various views, like index numbers refer to like elements.

DETAILED DESCRIPTION OF THE PREFERRED EMBODIMENT

Figure 5:
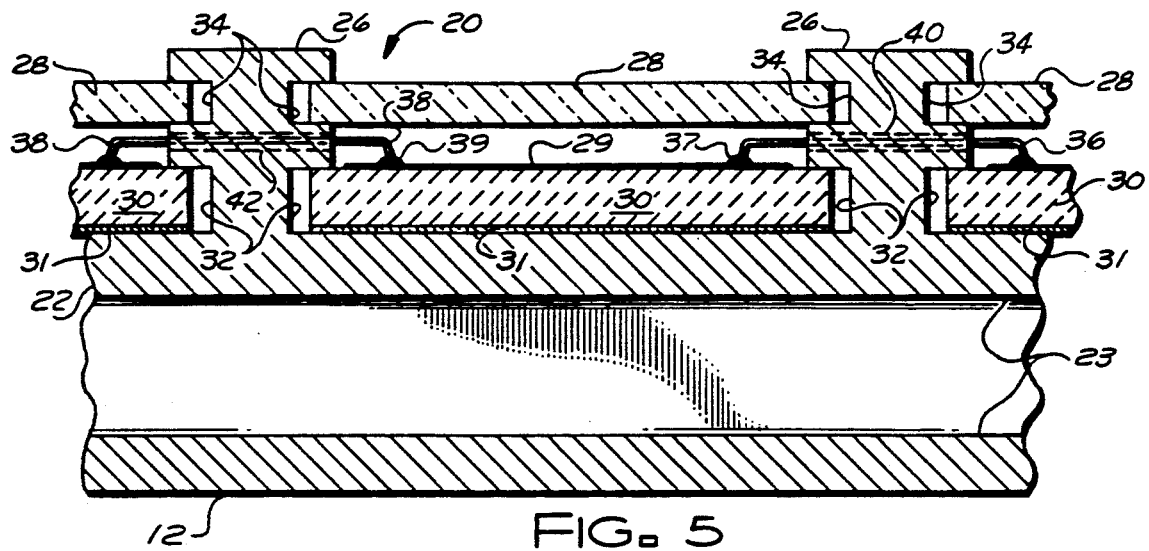
FIG. 5 is an exploded and more detailed view of the subject invention in cross-section.

Referring now to FIG. 1, a partially sectioned view of the prior art combustion section 10 of a jet engine is shown in perspective. Proceeding from the outside inward, annular elongated combustion section 10 comprises an outer combustion casing 11 supporting within its annular envelope combustion liner 13. Current combustion liners 13 are perforated with a plurality of openings (although transparent combustion liners may become available in the future), these openings permitting the transfer of radiant energy to the subject invention (which is not shown in FIG. 1). Combustion liner 13 comprises an elongated cylindrical shell enclosing an elongated annular volume, much like a donut stretched out in its axial direction, into which the jet fuel is sprayed and then burned. Turbine blades 16 are to the immediate rear of combustion liner 13. Immediately interiorly to the innermost cylindrical surface of combustion liner 13 and in concentric alignment is the inner combustion casing 14, also having an elongated cylindrical surface. Continuing to proceed radially inwardly, shaft shield 15 protects a centrally located elongated rotating shaft (not shown) which connects an air compressor (not shown) immediately forward of the combustion section 10 to the first stage of the turbine partially shown with blades 16.

The air compressor (not shown) immediately forward of the combustion section 10, which would be to the left of FIG. 1, compresses incoming air and drives it into the somewhat pointed leading edge of the combustion liner 13, the air dividing into three directions, i.e., between the combustion liner 13 and outer combustion casing 11, between the combustion liner 13 and inner combustion casing 14, and interiorly into the combustion liner 13 through the forward located openings shown in FIG. 1. The air which enters the forward located openings of the combustion liner 13 is mixed with a spray of jet fuel to be ignited and burned within it. Air which passes between the combustion liner 13 and the outer combustion chamber 11 and between combustion liner 13 and the inner combustion casing 14 serves to cool the combustion liner. It is this air passing between the combustion liner 13 and the outer combustion casing 11 that the subject invention depends upon, in part, to cool the invention from the heat resulting from the reception of the high intensity radiant energy generated interiorly to combustion liner 13 and passed through the plurality of openings in the outer portion of the shell comprising combustion liner 13.

FIG. 2 is a front sectioned view of the new modified outer combustion casing 12 taken along the engine longitudinally with Applicant's invention in place (replacing outer combustion casing 11 shown in FIG. 1). Flanges 12a and 12b in FIG. 2 replace flanges 11a and 11b shown in FIG. 1. In the preferred embodiment, Applicant's inventive structure is incorporated into the outer combustion casing on a jet engine and becomes a part of the original construction of an engine. Alternately, the inventive structure may be attached to a modified outer combustion casing and may replace the originally manufactured outer combustion casing 11 of an existing jet engine. In the view shown, the inventive structure is incorporated into an original outer combustion casing 12, manufactured as one piece, and one of the protruding longitudinal ribs 26 of the subject invention is shown facing inward towards the combustion liner 13 (FIG. 1). In the outside (top) portion of the new outer combustion casing 12 are also shown the plurality of fuel passageways 23 which permit the circulation of cold jet engine fuel helically around the modified outer combustion chamber prior to being injected into the combustion liner 13 volume (FIG. 1). The jet fuel passing through fuel passageway 23 serves the function of providing a heat sink for the invention in order to carry off heat which the invention receives during operation, also as later described.

Referring now to FIG. 3, a diagramic sectional front view (as if looking at the jet engine in FIG. 1 from the left hand side) is shown of the invention in place inside the new outer combustion casing 12.

FIG. 3 has been reduced in size relative to that shown in FIG. 1 and represents a pictorial diagram of the different elements which comprise the invention and their location relative to the new outer combustion casing 12 which replaced outer combustion case 11 in the prior art. In addition, there is no attempt to represent in FIG. 3 the different elements of the invention and the engine in a true dimensional relationship, in fact, the dimensions of parts of the invention have been greatly enlarged in relationship to the outer combustion casing 12 in order to bring out the highlights of the invention.

Proceeding from the central most portion outwardly, the outer periphery of the cylindrical surface of combustion liner 13 is shown represented by the innermost circle. This shell is perforated by a large plurality of openings as shown in FIG. 1. The invention is shown by Numeral 20 completely surrounding, but not touching, the outer periphery of combustion liner 13. It is noted that the radiant energy power source structure 20 is the inner surface of the new outer combustion casing 12. Base 22 supports the elongated ribs later described and provides the heat sink for the photovoltaic cells. Shown in the figure is the helically wrapped jet fuel lines 23 (here a circle) which convey the cold jet fuel from the jet aircraft fuel tanks to the fuel injectors which spray fuel interiorly to the combustion liner. These fuel lines run helically in base 22 and transversely to longitudinal ribs 26.

The end view of the subject radiant energy power source structure 20 in FIG. 3 shows various individual and longitudinal ribs 26 completely encircling the interior of the modified outer combustion casing 12 in a spaced apart orientation and it is intended that the radiant energy power source structure 20 should extend in outer combustion casing 12 over at least the full length of the perforations in its outer shell of combustion liner 13 (as shown in FIG. 1) in order that substantially all the radiant energy emitted through the plurality of perforations in the combustion liner 13 is captured by the invention's photovoltaic cells later discussed. Thus the invention comprises an elongated cylindrical shell which is spaced away from the perforated portion of the outer cylindrical shell of the combustion liner 13 adapted to capture radiant energy emitted from the combustion liner 13. It further has contained cooling means to carry off excess heat (in addition to the cooling provided by incoming air passing between the ribs 26 and combustion liner 13).

FIG. 4 is a cross-sectional view of a small section of the subject cylindrical radiant energy power source structure 20 transversely severed and then laid in a straight line for illustrative purposes. The radiant energy power source structure 20 comprises base 22 upon which protrudes transversely a plurality of stacked "T" shaped longitudinal ribs 26 which have, situated between a pair of longitudinal grooves formed in the ribs, an elongated transparent protective plate 28 overlaying an elongated row of individual photovoltaic cells 30. When the term "transparent" is used to describe the elongated protective plates 28, the term is meant to define a plate which is transparent to the radiant energies of interest which, by definition, will be the radiant energies which are at least within the bandwidth of the radiant energy useful to the photovoltaic cells. Sapphire is suggested as a suitable transparent protective plate.

For illustrative purposes, protective plate 28 and photovoltaic cell 30 are shown loosely spaced in longitudinal grooves formed in the longitudinal ribs 26, however, there is a requirement that the protective plate and the row of photovoltaic cells be held firmly in place, yet allowance be made for their increased temperature expansion. Therefore, the protective plates and photovoltaic cells do engage the horizontal portions of the grooves shown in the longitudinal ribs 26, and room for expansion is provided. This is illustrated in FIG. 5, infra.

FIG. 5 is a more detailed cross-sectional view taken between two elongated ribs shown in FIG. 4. At the lower most portion of FIG. 5 is the outer combustion casing 12 and a longitudinal sectional view of one of the helically wrapped jet fuel passageways 23 showing the top and bottom internal surfaces of the passageway. In the preferred embodiment, the elements represented by numerals 22 (base) and 12 (outer combustion casing) are one solid piece with helical fuel passageway 23 circling interiorly. Inasmuch as base 22 contains the helical wrapped jet fuel line 23 and all constitute the new outer combustion casing 12, heat energy collected by the invention (in addition to radiant light energy) is transferred to the jet fuel flowing through the passageway 23. It should also be remembered that air passing over the invention also draws off much heat. Rising above base 22, upward protruding longitudinal ribs 26 are seen with their oppositely situated longitudinal grooves 32 and 34. Positioned securely in the lower most longitudinal groove 32 of longitudinal ribs 26 is a row of photovoltaic cells 30, the cells so situated that a small portion of opposite sides of their top surface engage the upper side of groove 32. The cells bottom surfaces rest firmly upon base 22. In order to assure a good thermal contact, it is suggested that all voids between the bottom of photovoltaic cells 30 and base 22 be filled with a thermally conducting gel, shown by numeral 31. Photovoltaic cells 30 do not engage longitudinal grooves 32 in the horizontal direction to the full depth of grooves 32, but a void is created therein to allow for expansion of photovoltaic cells 30 within the grooves.

Photovoltaic cells 30, prior to installation in the longitudinal grooves 32, are constructed of an appropriate semiconductor material 29 (shown by a dark line) situated upon the top of an electrically insulative (but thermally conductive) substrate, such as alumina. Semiconductor material 29 is electrically connected to leads 36 and 38 (later discussed), but does not physically touch ribs 26.

Immediately above photovoltaic cell 30, protective plate 28 is held between opposite upper longitudinal grooves 34 of oppositely situated longitudinal ribs 26 in a similar manner as cell 30 was held in lower longitudinal grooves 32 with the exception that only a small portion of each side of the bottom surface of protective plate 28 is held within longitudinal groove 34. It is intended that a secure fit of cell 30 and of protective plate 28 be accomplished in the longitudinal grooves of the longitudinal ribs. Thermal expansion of the protective plates 28 is permitted by a gap between the sides of the cell and plate and the vertical bottoms of the longitudinal grooves 34.

Separating cell 30 and protective plate 28 is an air space, nominally about 20 mils (20/1000 inch), created between the top of cell 30 and the lower surface of transparent protective plate 28. As explained later, into this space air will be injected in order to equalize the pressure on both sides of protective plate 28.

Lastly shown in FIG. 5 are electrical wires 36 and 38 connected to opposite sides of semiconductor material 29 at connection points 37 and 39 respectively on photovoltaic cell 30. Each of the electrical wires 36 and 38 connect to the circularly adjacent photovoltaic cells located in adjacent channels formed by adjacent longitudinal ribs 26. It is noted that the electrical wires 36 and 38 pass through openings 40 and 42 respectively formed transversely across longitudinal ribs 26 and across from each other, and immediately above the cells 30. Electrical wires 36 and 38 carry insulation in their passage through openings 40 and 42.

As shown in FIG. 5, photovoltaic cells 30 are shielded by transparent protective plates 28 from the air passing through the jet engine between the outer surface of combustion liner 13 and the top of radiant energy power source structure 20. This air often contains particles of matter, such as suspended dirt and water vapor, which are a source of concern to the photovoltaic cells. In addition, there is the possibility of a momentary flame exiting out of one or more of the plurality of openings in the combustion liner 13, which is also a source of potential problems to the photovoltaic cells.

Further, photovoltaic cells 30 are fully protected against the absorption and retention of excessive heat by their direct thermal connection to base 22, which has contained within it the heat removing fuel circulating on its way to the injectors passing through helically wrapped jet fuel lines 23. Mathematical calculations tend to indicate that it may not be necessary for fuel in the helically wrapped jet fuel lines in the outside base portion 22 of outer combustion casing 12 to remove large amounts of heat since the largest part of heat generated by the combustion liner is carried away by the incoming air which surrounds the combustion liner. In such case, the base 22 may be sufficient heat sink for the inventive radiant energy power source structure 20 without circulating fuel.

Figure 6:
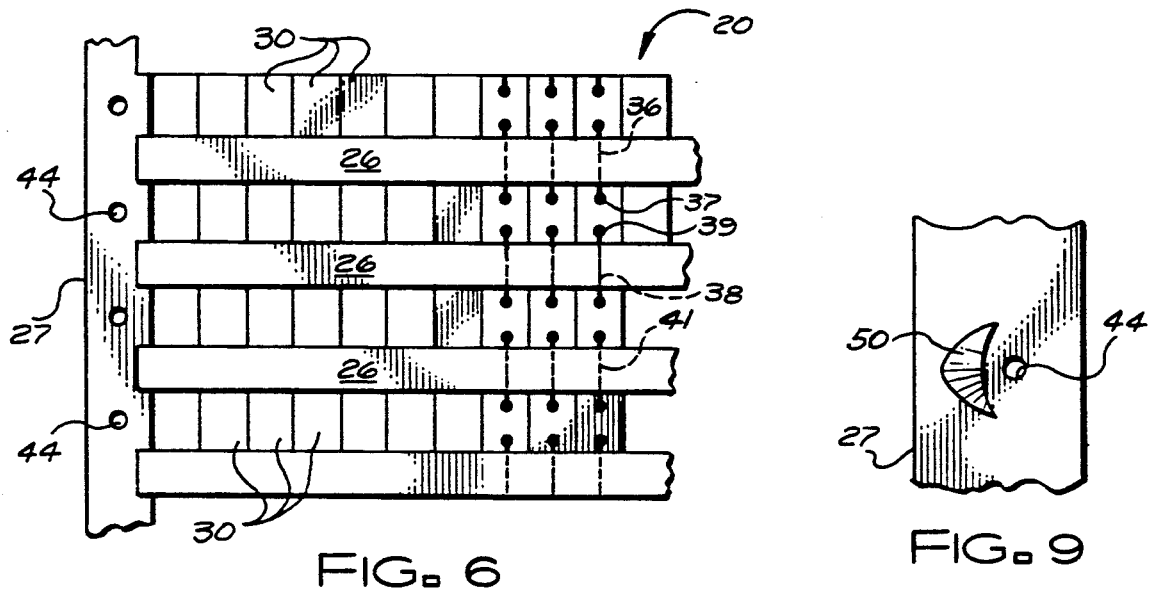
FIG. 6 is a top view of a portion of the invention.

Referring now to FIG. 6, a top view of the front end of the inventive radiant energy power source structure 20 is shown. Proceeding from left to right, at the far left is head 27 which constitutes the front most portion of the radiant energy power source structure 20 and is constructed similarly to the elongated ribs 26 in that it protrudes upward from the base and does have a lower and upper groove on the part of the head which faces the protective plate and photovoltaic cells. Front end is defined to mean the end which first receives the incoming air passing through the jet engine. It would be located at the left most part of the jet engine combustion section 10 shown in FIG. 1. In FIG. 6 are shown the longitudinal ribs 26 whose upper and lower grooves join with the same named grooves of head 27, and which run a length substantially equal to the width of the perforated portions of the combustion liner 13 and which are terminated at their rear end with a tail similar to head 27. It is realized that either the head or the tail must be removable from base 22 in order that the protective plates and the photovoltaic cells be initially placed into structure 20 or removed for replacement or repair and then re-inserted. For convenience, the tail was chosen as the removable part.

Not seen in FIG. 6 because of their transparency are the transparent protective plates 28. It is intended that only one plate is needed for the whole length between two elongated ribs 26. Immediately underneath these transparent protective plates are the multiplicity of photovoltaic cells 30 shown in FIG. 6. Obviously, electrical connections between adjacent cells by electrical wires 36, 38, and 41, must be accomplished before the insertion of the transparent protective plates. A portion of the electrical connections are shown which connect every circular row of cells.

Because of the present physical constraints of the photovoltaic cells, there is a plurality of photovoltaic cells in each channel formed between two elongated ribs, and these individual cells 30 are shown in FIG. 6. Inasmuch as the energy at all points in a circle along any one location in the longitudinal direction of the combustion chamber is substantially equal, the photovoltaic cells 30 shown in FIG. 6 are connected serially in the annular or circular direction. In this manner, the current generated by each photovoltaic cell is equal, and the resultant collected voltage is the sum of each cell. This is shown in FIG. 6 by the electrical connection of wires 36, 38, and 41 (shown partially dotted and partially full) between the different adjacent photovoltaic cells 30. Shown also are the electrical connection points 37 and 39 on one photovoltaic cell as representative of each photovoltaic cell. At one point on each of the circular chains of electrical connections, the connection is broken and the electrical wires from each end then passed through base 22 to outside the engine to be used as the aircraft electrical system.

It is noted that a number of openings 44 are shown in head 27 in FIG. 6. These are openings which allow the passage of air into the radiant energy power source structure 20 and more specifically, to the air gap (previously mentioned) created between the top of photovoltaic cell 30 and the bottom of protective plate 28. By bleeding air into this gap between the cells and the plates, excessive pressure differentials on opposite sides of protective plate 28 are avoided. These holes or openings 44 are placed in the front head 27 portion of the radiant energy power source structure 20 in order to intercept the incoming air passing between the combustion liner 13 and the outer combustion casing 12. Thus, with the rushing incoming air, air is forced into the gap between the cell and the plate which results in captive air pressure substantially equal to the air pressure on the top of the protective plate by the air passing over the invention.

Figure 7:
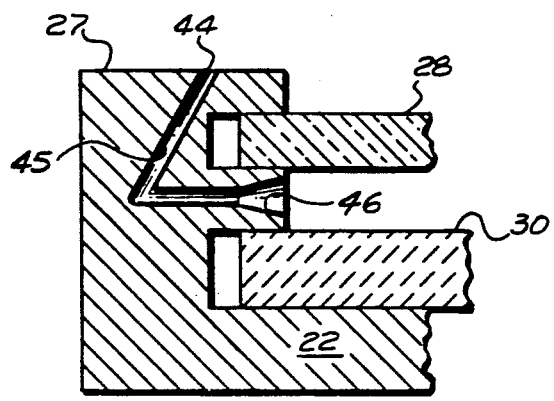
FIG. 7 is a cross-sectional view of the subject invention showing the air passageway into the air gap between the protective plate and photovoltaic cell.

Since it is advantageous that the air passageway within head 27 which leads from opening 44 into the air gap between the cell and the plate be as immune as possible to clogging or plugging by a particle of matter, such as sand or the like, carried by the in-rushing air, a structure such as shown in FIG. 7 is suggested. In FIG. 7, a cross-sectional view is taken of head 27 showning opening 44 and the passageway 45 which communicates opening 44 with the air gap between protective plate 28 and photovoltaic cell 30. It is particularly noted that to discourage particles from entering opening 44 and lodging therein, the air passageway 45 slants backwards at an acute angle towards the direction from which the air comes before it enters into the air gap between the plate and the cell. Next, at the entrance of the passageway 45 into the air gap between the protective plate and the photovoltaic cell, the passageway is opened up with a spreading opening 46 which forms a beveled edge. In addition, the passageway tends to cool the incoming air.

Figure 9:
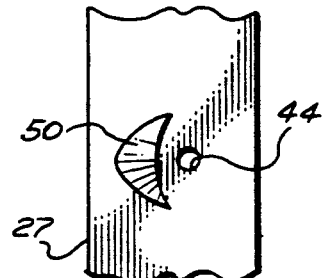
FIG. 9 is a top view of the alternate embodiment detailed in FIG. 8.
Figure 8:
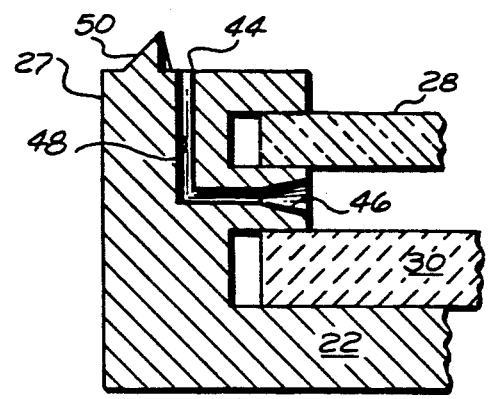
FIG. 8 is a cross-sectional view of an alternate embodiment of the air passageway leading into the air gap between the protective plate and photovoltaic cell.

FIGS. 8 and 9 show an alternate embodiment of the opening 44 and connecting air passageway 48 which proceeds immediately downwards before it turns into the air gap between the photovoltaic cell 30 and the protective plate 28. FIG. 8 is a cross-sectional side view of head 27, and FIG. 9 is a top view of a portion of head 27. Here again, the beveled opening 46 characterizes the end of air passageway 48. To protect against matter lodging in the opening 44, a triangular shaped mound 50 is situated immediately forward of the opening 44 in head 27 to protect against and deflect solid matter which may be in the air stream.

While a preferred embodiment has been shown and described, it will be understood that there is no intent to limit the invention by such disclosure, but rather it is intended to cover all modifications and alternate constructions falling within the spirit and the scope of the invention as defined in the appended Claims.

I claim:

1. A radiant energy power source structure for providing electrical power to a vehicle utilizing radiant energy from a jet engine, the jet engine of the type having a radiant energy emitting combustion chamber formed from spaced apart inner and outer concentric elongated cylindrical liners, the combustion chamber outer liner concentrically surrounded by an elongated annular outer combustion casing, the radiant energy power source structure comprising:

a modified elongated annular combustion casing, said modified casing defining in part an elongated annular base situated radially outwardly of the combustion chamber outer liner;

a plurality of pairs of circumferentially spaced apart ribs operably attached to said elongated annular base, each of said ribs projecting radially inwardly from said base and extending longitudinally in a direction parallel to the longitudinal axis of said casing;

at least one photovoltaic cell operably situated between each pair of longitudinal ribs, said at least one photovoltaic cell adapted to receive the radiant energy emitted from the combustion chamber whereby the photovoltaic cell generates electrical current providing electrical power to the vehicle;

a set of opposed, longitudinally extending grooves formed in said pair of ribs at a location radially spaced from said at least one photovoltaic cell; and a protective plate removably carried in said grooves, said protective plate being transparent to the radiant energy transmitted from said combustion chamber which is at least within the bandwidth of radiant energy useful to said photovoltaic cells.

2. The radiant energy power source structure as defined in claim 1 further including a helical passageway formed in said elongated annular base, said helical passageway adapted to pass jet engine fuel therethrough whereby the jet engine fuel carries off excess heat resident in said base received from the emitted radiant energy.

3. The radiant energy power structure as defined in claim 1, wherein each photovoltaic cell is electrically connected in series to another photovoltaic cell located substantially circumferentially adjacent said cell, such that said photovoltaic cells form a serially connected circular chain extending around the inner surface of said base.

4. The radiant energy power source structure as defined in claim 3 wherein said photovoltaic cells series connection includes a break in said series connection whereby electrical power may be withdrawn from the photovoltaic cells series connection at the break.

5. The radiant energy power source structure as defined in claim 1, wherein said at least one photovoltaic cell comprises a plurality of photovoltaic cells arranged in a longitudinally extending row substantially parallel to said ribs, wherein each cell in said row is connected in series to a corresponding cell at approximately the same circumferential location, thus forming a plurality of chains of serially connected photovoltaic cells longitudinally adjacent to each other.

6. The radiant energy power source structure as defined in claim 1, wherein each pair of ribs comprises a set of opposed, longitudinally extending grooves located adjacent said base for receiving said at least one photovoltaic cell.

7. The radiant energy power source structure as defined in claim 1, wherein sufficient spacing is provided between said ribs and said at least one photovoltaic cell to allow for thermal expansion of said cell.

8. The radiant energy power source structure as claimed in claim 1, wherein said grooves are dimensioned to provide sufficient spacing between said protective plate and said ribs to allow for thermal expansion of said plate.

9. The radiant energy power source structure as claimed in claim 1, further comprising means for introducing air into the space between said at least one photovoltaic cell and said protective plate to avoid excessive pressure differentials on opposite sides of said plate.

10. A radiant energy power source structure for providing electrical power to a vehicle utilizing radiant energy from a jet engine, the jet engine of the type having a radiant energy emitting combustion chamber formed from spaced apart inner and outer concentric elongated cylindrical liners, the combustion chamber outer liner concentrically surrounded by an elongated annular outer combustion casing, the radiant energy power source structure comprising:

a modified elongated annular combustion casing, said modified casing defining in part an elongated annular base situated radially outwardly of the combustion chamber outer liner;

a plurality of pairs of circumferentially spaced apart ribs operably attached to said elongated annular base, each of said ribs projecting radially inwardly from said base and extending longitudinally in a direction parallel to the longitudinal axis of said casing, the space between each pair of ribs defining a longitudinally extending channel; and a plurality of photovoltaic cells operably situated in said channels between said ribs, said cells adapted to receive the radiant energy emitted from the combustion chamber whereby the photovoltaic cells generate electrical current providing electrical power to the vehicle, said cells being arranged to form a plurality of longitudinally extending rows, wherein each cell in each row is serially connected to a corresponding cell in approximately the same circumferential location in a neighboring row, thus forming a plurality of chains of serially connected photovoltaic cells longitudinally adjacent to each other, with a break being formed in each of said chains whereby electrical power may be withdrawn from said chain at such break;

a set of opposed, longitudinally extending grooves formed in each pair of ribs at a location radially inward of said photovoltaic cells; and a protective plate received in said set of grooves of each pair of ribs, said protective plate being transparent to the radiant energy transmitted from said combustion chamber which is at least within the bandwidth of radiant energy useful to said photovoltaic cells.

11. The radiant energy power source structure as defined in claim 10 wherein said longitudinal ribs include a plurality of openings situated transversely therethrough, said openings located between said base and said set of longitudinal grooves whereby said plurality of photovoltaic cells are electrically series connected by wires passing through said openings.

12. The radiant energy power source structure as defined in claim 10 further including a head operably attached to said longitudinal ribs and said elongated annular base, and a tail operably attached to said longitudinal ribs and elongated annular base, said head and said tail protuding radially inwardly from said elongated annular base and perpendicular to said longitudinal ribs, said head having a flat top.

13. The radiant energy power source structure as defined in claim 12, wherein said head includes a plurality of passageways, each of said passageways having one end opening through the top of said head and an opposite end communicating with the space between a protective plate and the underlying row of cells to allow air from the top of said head to enter said space.

14. The radiant energy power source structure as defined in claim 13, wherein said head includes a protective mound situated upstream of said one end of said passageway for protecting against and deflecting solid matter which may be included with said air.

15. The radiant energy power source structure as defined in claim 10, wherein each protective plate is spaced radially inwardly from the underlying row of photovoltaic cells.

* * * * *